United States Patent
Yom et al.

[11] Patent Number: 5,831,879
[45] Date of Patent: Nov. 3, 1998

[54] DIGITAL TRANSMIT FILTER

[75] Inventors: Dong Hong Yom, Cupertino; Sung-Moon Yang, Los Altos, both of Calif.

[73] Assignee: Harris Corporation, Melbourne, Fla.

[21] Appl. No.: 361,649

[22] Filed: Dec. 22, 1994

[51] Int. Cl.⁶ .................................................. G06F 17/10
[52] U.S. Cl. .............................. 364/724.012; 364/724.13; 364/724.16
[58] Field of Search ............................. 364/723, 724.01, 364/724.13, 724.1, 724.16

[56] References Cited

U.S. PATENT DOCUMENTS

| | | | |
|---|---|---|---|
| 4,358,853 | 11/1982 | Qureshi | 375/296 |
| 4,661,948 | 4/1987 | Shapiro et al. | 370/295 |
| 4,777,612 | 10/1988 | Tomimitsu | 364/724.13 |
| 4,965,536 | 10/1990 | Yoshida | 332/103 |
| 5,157,693 | 10/1992 | Lemersal, Jr. et al. | 375/308 |
| 5,225,795 | 7/1993 | Iinuma | 332/100 |
| 5,253,271 | 10/1993 | Montgomery | 375/295 |
| 5,258,939 | 11/1993 | Johnstone et al. | 364/724.1 |
| 5,396,489 | 3/1995 | Harrison | 364/72 |

*Primary Examiner*—Chuong Dinh Ngo
*Attorney, Agent, or Firm*—Rogers & Killeen

[57] ABSTRACT

Method and filters for reducing the number of circuit components and/or the operating speed of the components of a filter used to shape digital transmit symbols for conversion to analog modulation communication systems. A digital signal is processed using M circuit stages. The stages multiply a delayed digital signal and a further delayed digital signal with a corresponding filter coefficient. The output signals of the stages are multiplexed to provide shaped digital transmit symbols. The stages are configured to reduce the number of circuit components and/or operating speed.

6 Claims, 5 Drawing Sheets

DIGITAL TRANSMIT FILTER

BACKGROUND OF THE INVENTION

Bandwidth efficient modulation is a necessity in high capacity radio communication systems. Quadrature amplitude modulation is bandwidth efficient, and the shaping of multi-level data pulses in such modulation systems is of fundamental importance if freedom from intersymbol interference, and thus bandwidth efficiency, is to be achieved. Since the shape of the pulse will determine the spectrum of the data signals, this shaping of data pulses is generally referred to as "spectral shaping".

To accomplish the desired spectral shaping, the early prior art used pure analog inductor and capacitor or "LC" filters. However, such analog filters require, in addition to the shaping filter, complex amplitude and delay equalizers which required tuning by skilled technicians, thus increasing expense and reducing reliability.

This led to the development of digital correction filters such as disclosed by Y. Saito, et al., "A New Way Of Generating Spectral Shaped High-Speed and Multi-Level Digital Signals", *Transactions Of The Institute Of Electron And Communication Enqr. Japan*, Part B, Vol. J67B, No. 3, March 1984, pp. 265–272. As suggested by Saito, et al., the filter was based on the use of read only memory or "ROM" and digital shift registers, resistor dividers and an analog summer in a transversal binary filter. Improvements, still ROM based, are disclosed in A. Siller, "Spectral Shaping Of M-State Data Signal For Bandlimited Communications", IEEE ICC Proceedings, June 1987, pp. 1716–1723. In all systems using analog summers, the filter transfer function is directly affected by resistor values which in turn are subject to limitation by manufacturing precision, temperature dependency, aging effect, etc.

The present invention relates to the versatile method and circuit for digitally accomplishing spectral shaping with minimum circuit complexity, minimum component speed requirements, or optimization of these two characteristics.

More specifically, the present invention is directed to a circuit and method of combining an up-sampler and digital filter.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

The combination of up-sampling and digital filtering techniques in the implementation of the transmit filter functions is well known. In a typical baseband transmitter, transmit symbols d are up-sampled at the sampling rate S=RF, where F is the symbol rate and R is the up-sampling ratio, R being typically 2 or more, to provide up-sampled transmit symbols x to the digital filter. The digital filter in turn provides the shaped digital transmit symbols y which are passed through the digital-to-analog converter and low pass filter as the analog transmit pulse which is used to modulate the transmitter carrier signal.

The result of the up-sampling becomes:

$$x(n)=d(i) \qquad (1)$$

where d(i) is the input sequence at the input symbol rate, and when n=Ri and is otherwise zero.

The output signal from the digital filter y(n) becomes:

$$y(n) = \sum_{k=0}^{L-1} [h(k)][x(n-k)] \qquad (2)$$

where L is the length of the unit sample response or the number of taps on the filter, i.e., the number of filter coefficients, and where h(k) is the unit sample response of the digital filter.

Figure 1:
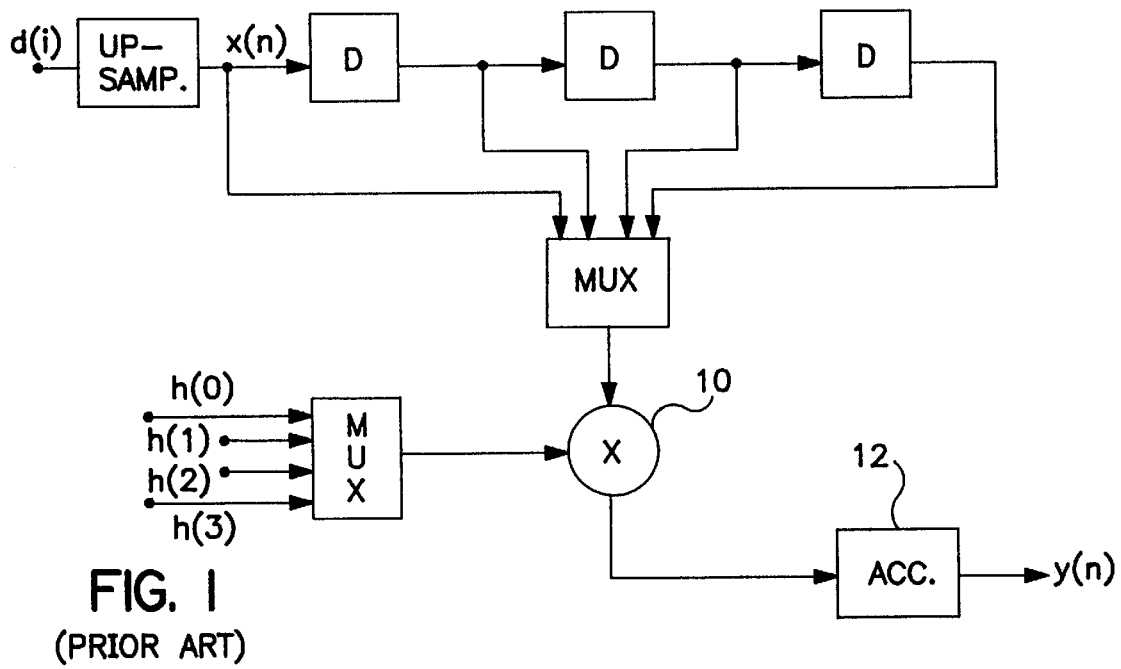
FIG. 1 is a functional block diagram illustrating a conventional prior art filter with time sharing of a single multiplier and accumulator, where all components (except delay circuits) operate at a rate LS where S is the sampling rate and where L is the number of filter coefficients.

In general, the number of filter coefficients L and the up-sampling ratio R are given as system design parameters. Equation (2) is typically implemented in the prior art for 4 filter coefficients and an up-sampling ratio of 2 by the filter of FIG. 1. With reference to FIG. 1, the up-sampled input to the filter x(n) is successively delayed in suitable conventional delay circuits D and the four signals multiplexed into a suitable conventional multiplier 10 to which four filter coefficients h(0) through h(3) are multiplexed. The multiplication products are accumulated in a suitable conventional accumulator 12 to provide the output signal y(n).

As shown in FIG. 1, the filter requires two L to 1 multiplexers, one multiplier and one accumulator, all of which must operate at L times the sampling rate S, or LS.

Figure 2A:
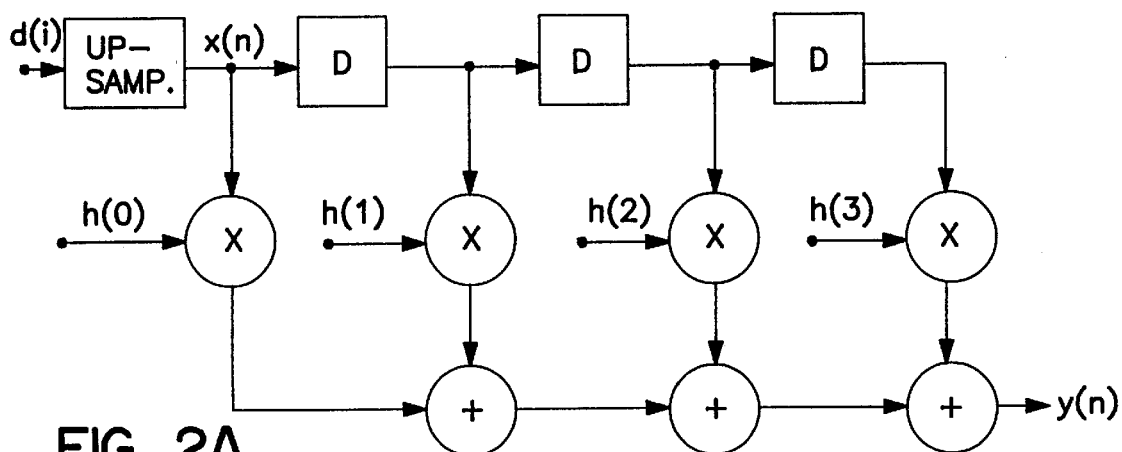
FIG. 2A is a functional block diagram illustrating the components of a prior art parallel processing filter.

A reduction in component operating speed below LS may be achieved in prior art filters by parallel processing. For example, and as shown in FIG. 2A with L=4, the input signal x(n) may be successively delayed in the three suitable conventional delay circuits D, with each of the four components multiplied by one of the four filter coefficients h(0)–h(3) and successively summed in the three adders to provide the output signal y(n).

The same output signal y(n) can be obtained by the filter of the present invention through the use of a reduced number of the same circuit components.

By the utilization of the properties of Equation (1), Equation (2) may be written:

$$y(n) = \sum_{p=0}^{L/R-1} [h(Rp + k)][x(Rm - Rp)] \quad (3)$$

when n=Rm+k, for k=0, 1, ..., R–1.
Equivalently, Equation (3) may be written:

$$y(n) = \sum_{p=0}^{\frac{L}{R}-1} [h(Rp + k)][d(m - p)] \quad (4)$$

when n=Rm+k, for k=0, 1, ..., R–1.

Figure 2B:
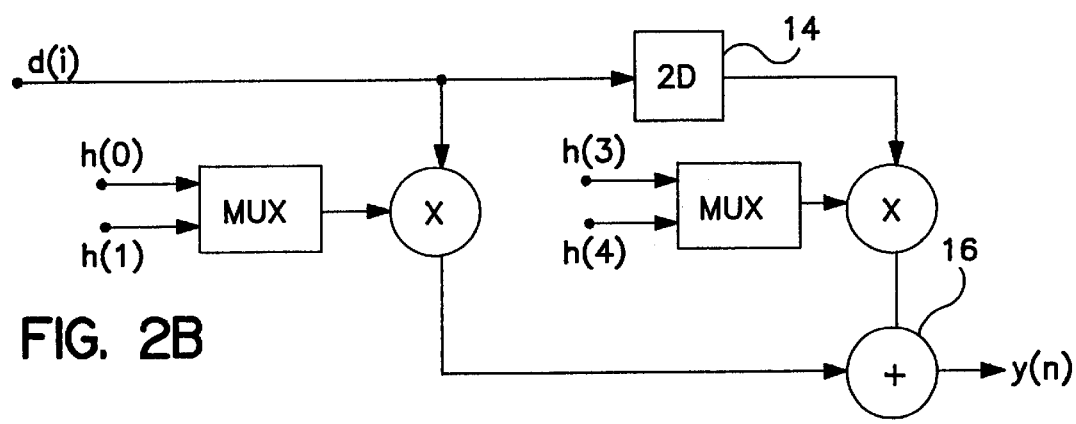
FIG. 2B is a functional block diagram of one embodiment of the filter of the present invention illustrating the reduced circuit complexity achieved by multiplexing filter coefficients at the sampling rate S with input data propagating at the input symbol rate F, where the sampling rate S is the product of the input symbol rate F multiplied by the up-sampling ratio R.

With reference to FIG. 2B with four filter taps and an up-sampling ratio of two, the input sequence d(i) at the symbol rate F is subjected to two units of delay in delay circuit 14 and each of the two signals multiplied by two of the 4 multiplexed filter coefficients h(0)–h(3) and combined in a single adder 16. The multiplexing of the filter coefficients h(k) at the sampling rate S while the input data propagates at the input symbol rate F reduces the number of multipliers to L/R or 2 and the number of adders to L/R–1 or 1. For the same component operating speed, the circuit complexity is reduced by a factor of 1/R or ½.

Figure 3A:
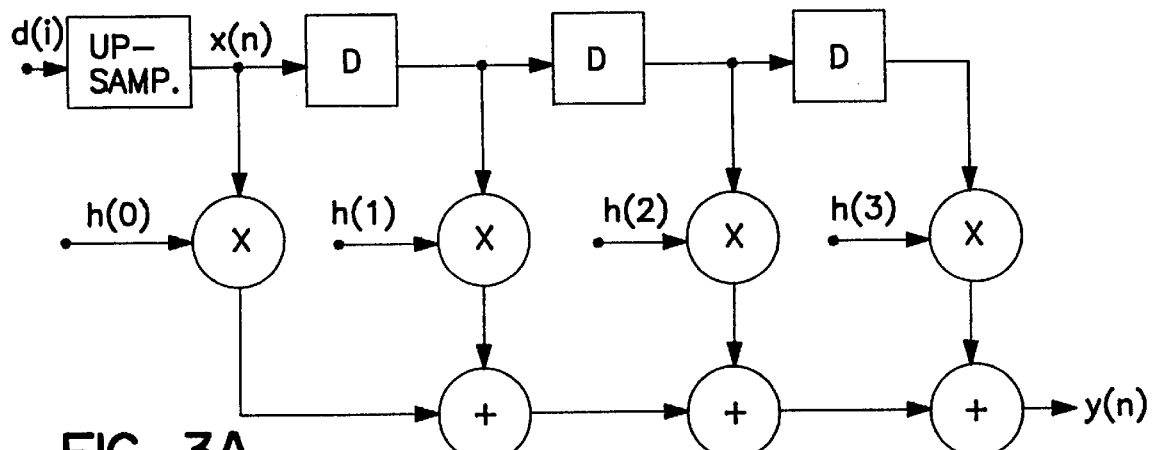
FIG. 3A is a functional block diagram illustrating a prior art parallel processing filter where all components operate at a rate equal to S.

A reduction in the needed operating speed of the circuit components may also be achieved over prior art filters. As shown in FIG. 3A in a system with 4 filter coefficients, and discussed above in connection with FIG. 2A, the operating speed of the components in the prior art filter with parallel processing is the sampling rate S.

Figure 3B:
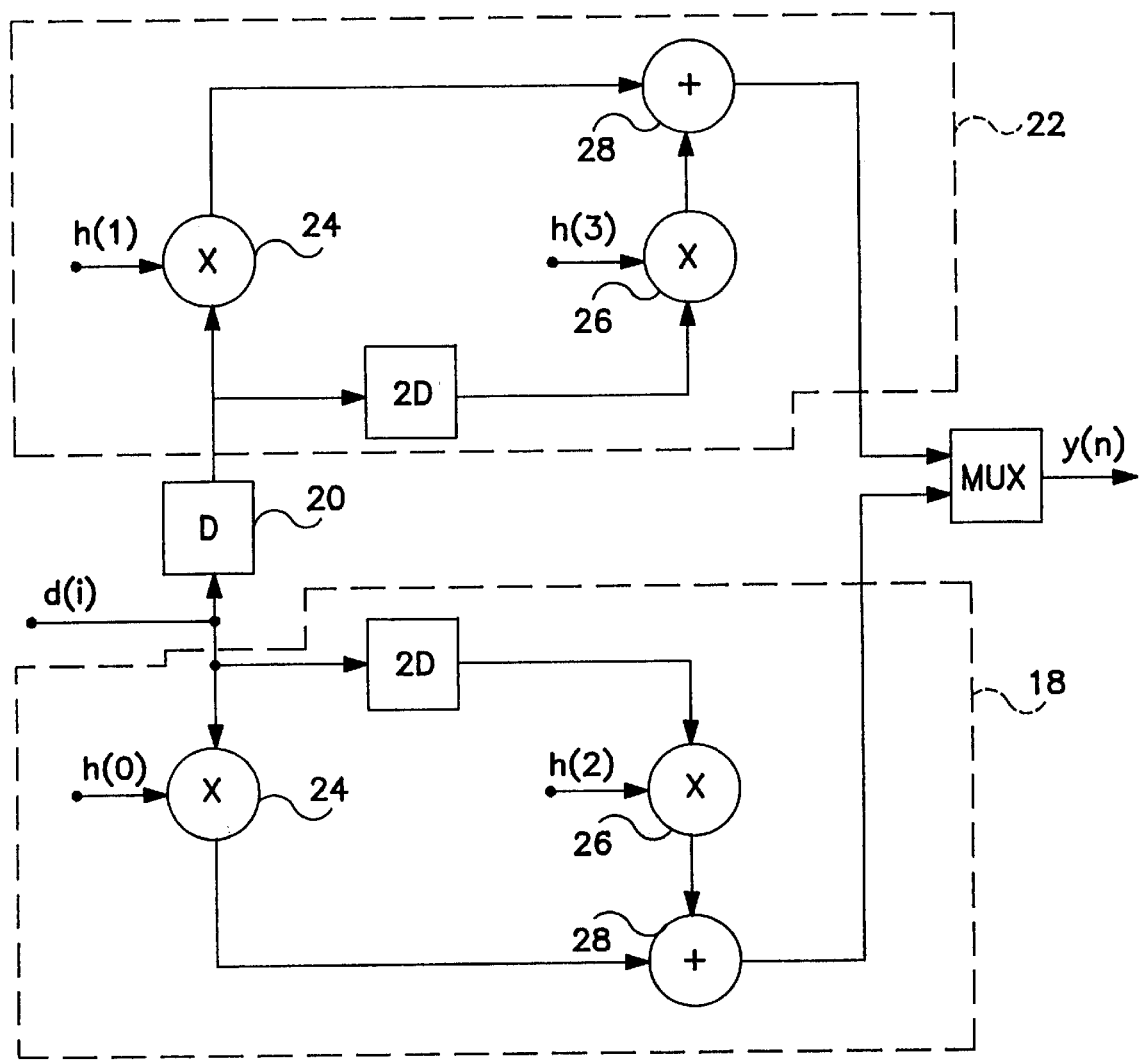
FIG. 3B is a functional block diagram of one embodiment of the filter of the present invention illustrating the reduced circuit operating speed achieved by grouping the filter coefficients in two groups, processing symbols at the symbol rate F in each group, and multiplexing the output signals of the groups at the sampling rate S, thereby achieving a reduction in the operating speed of the circuit components by a factor of ½, where the up-sampling ratio is two.

However, the embodiment of the filter of the present invention illustrated in FIG. 3B may be used to reduce the needed component operating speed by a factor 1/R compared to the circuit of FIG. 3A by the calculation of each sum in Equation (4) at the symbol rate F and multiplexing these sums at the sampling rate S.

As shown in FIG. 3B in a system with 4 filter coefficients and an up-sampling ratio R=2, the filter input signal d(i) may be applied directly to one processing circuit 18 and through a delay circuit 20 to an identical processing circuit 22. In both circuits 18 and 22, the filter input signal is applied directly to one multiplier 24 and twice delayed for application to a second multiplier 26. The 4 filter coefficients h(0)–h(3) are applied to the multipliers and the products therefrom summed in adders 28 and then multiplexed to provide the output y(n). For the same level of circuit complexity, the component operating speed of the embodiment of FIG. 3B is reduced by a factor of ½.

Figure 3C:
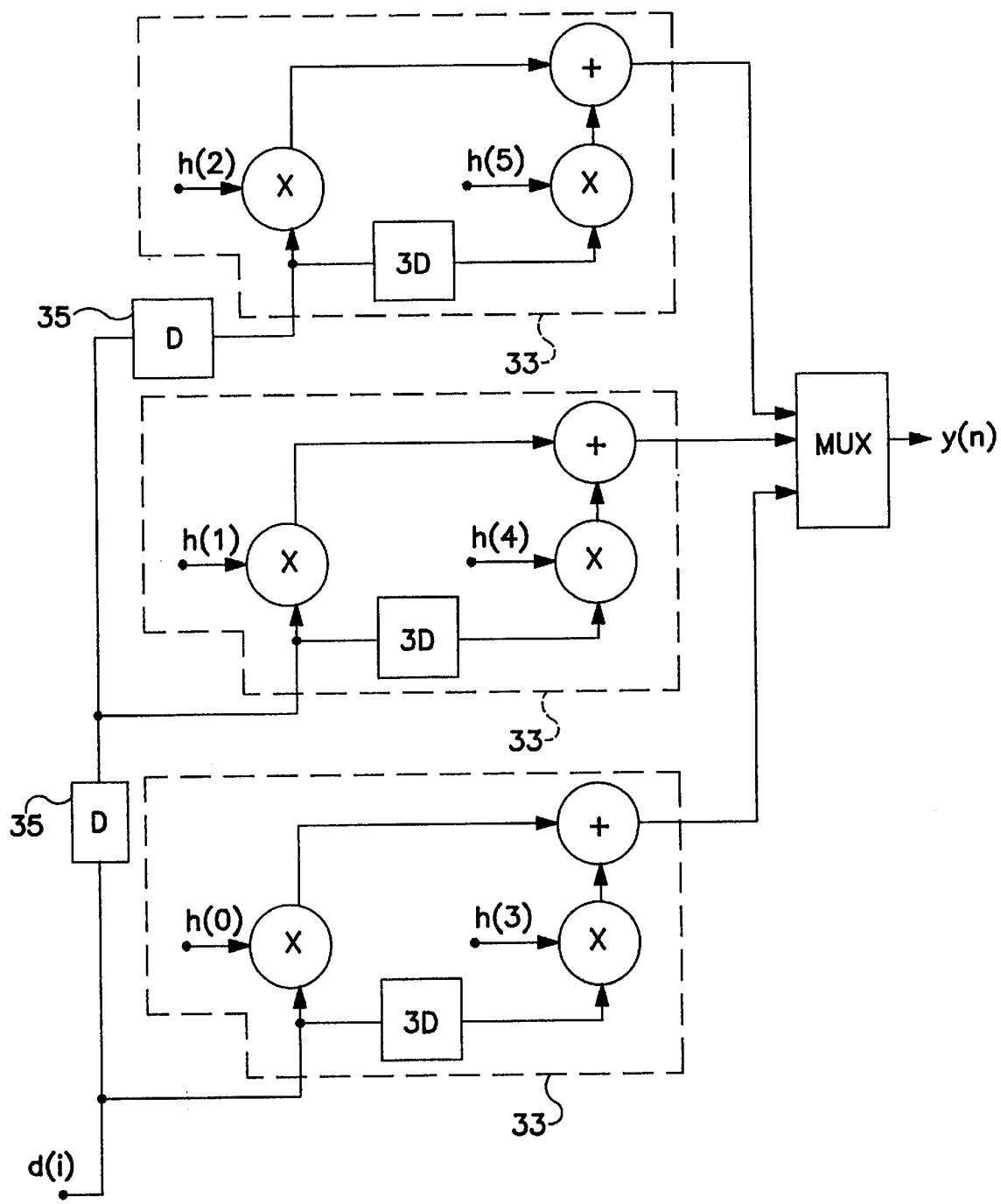
FIG. 3C is a functional block diagram of one embodiment of the filter of the present invention illustrating the reduced circuit operating speed achieved by grouping the filter coefficients in three groups, processing symbols at the symbol rate F in each group, and multiplexing the output signals of the three groups at the sampling rate, thereby achieving a reduction in the operating speed of the circuit components by a factor of ⅓, where the up-sampling ratio is three.

The number of processing circuits is equal to the up-sampling ratio R which may be any integer greater than or equal to 2. For example, an embodiment of the filter with 6 filter coefficients and an up-sampling ratio of 3 is illustrated in FIG. 3C. As shown in FIG. 3C, there are three processing circuits 33 serially connected through a single unit delay circuit 35. Note that the delay within each of the processing circuits 33 is equal to the up-sampling ratio.

Figure 4A:
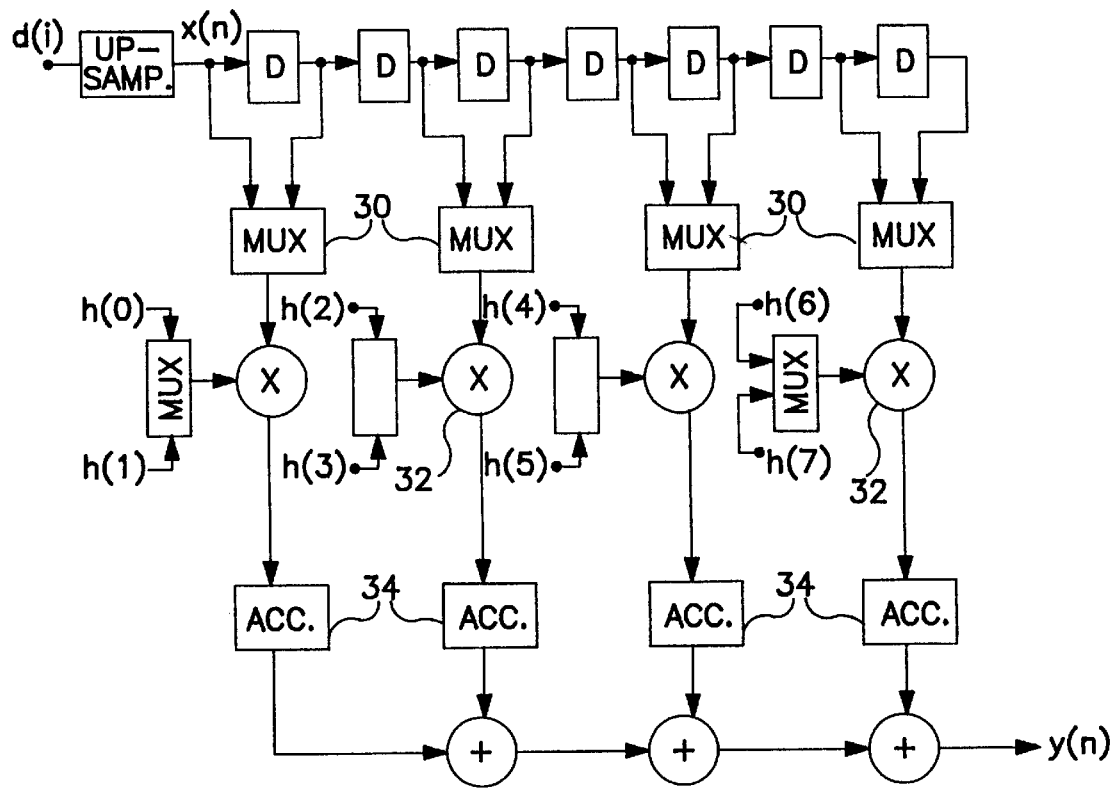
FIG. 4A is a functional block diagram illustrating a prior art compromise between filter circuit complexity and component operating speed in which the components (except delay circuits) operate at twice the sampling rate.

In FIG. 3C, the input signal d(i) is applied directly to one processing circuit 33, delayed one unit in the delay circuit 35 and applied to a second one of the processing circuits 33, and delayed a further unit in delay circuit 35 and applied to the third processing circuit 33. The delay within each of the three circuits 33 will be three units, and the output signals from the three circuits will be multiplexed to provide the output signal y(n). As shown in FIG. 4A in an embodiment with 8 filter coefficients and an up-sampling ratio of 4 in the up-sampler, the prior art filters may mix the techniques of FIGS. 1 and 2A to compromise the conflicting goals of minimum circuit complexity and minimum component operating speed.

With reference to FIG. 4A, the input signal may be successively delayed in seven delay circuits D, and adjacent pairs of signals multiplexed in multiplexers 30 for application to multipliers 32 to which multiplexed pairs of the filter coefficients h(0)–h(7) are applied. The multiplication products are accumulated in accumulators 34 and successively summed in adders 36 to provide the output signal y(n).

However, Equation (4) may also be implemented in the filter of the present invention to compromise circuit complexity and component operating speed. If the filter coefficients are grouped, e.g., even and odd numbered coefficient groups, Equation (4) may be rewritten as:

$$y(n) = \sum_{p=0}^{\frac{L}{R}-1} [h(Rp + k)][d(m - p)] \quad (5)$$

when n=Rm+k, for k=0, 2, 4, ..., R–2. and $$y(n) = \sum_{p=0}^{\frac{L}{R}-1} [h(Rp + k)][d(m - p)] \quad (6)$$

when n=Rm+k, for k=1, 3, 5, ..., R–1.

For each of the partial sums represented by Equations (5) and (6), the filter coefficients may be multiplexed at one-half the sampling rate into the multipliers and the outputs therefrom summed together. The two partial sums may then be multiplexed together for the final output signal. If the filter coefficients L are grouped into M groups of L/M coefficients, the filter may be implemented with M(L/R) multipliers and M(L/R–1) adders with the circuit components operating at a speed of S/M, with S=FR.

Figure 4B:
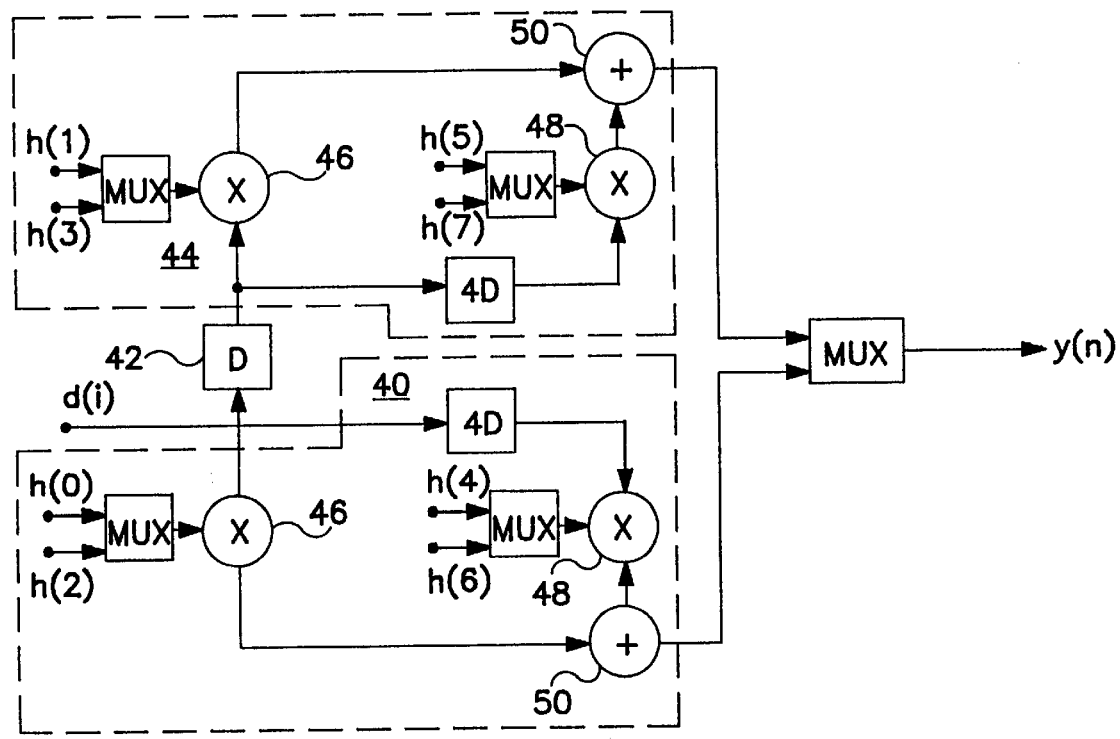
FIG. 4B is a functional block diagram of an embodiment of the filter of the present invention illustrating a compromise in circuit complexity and component operating speed, where the up-sampling ratio is two.

In the embodiment illustrated in FIG. 4B with L=8, R=4 & M=2, the input signal d(i) is applied directly to one processing circuit 40 and through a delay circuit 42 to an identical processing circuit 44. In both circuits 40 and 44 the input signal is applied to one multiplier 46 and delayed four times for application to a second multiplier 48. The filter coefficients h(0) through h(7) are multiplexed in pairs through the multipliers and the partial sums summed in adders 50 and then multiplexed to provide the output signal y(n).

From the foregoing, it will be apparent that the filter of FIG. 4B when compared to the prior art filter of FIG. 4A operates its components at one-quarter the speed with a circuit complexity of about the same. This technique may be applied to any M where R>M and M is a factor of R.

The number of processing circuits is equal to M which is a factor of R where R is an integer and greater than 4.

Figure 4C:
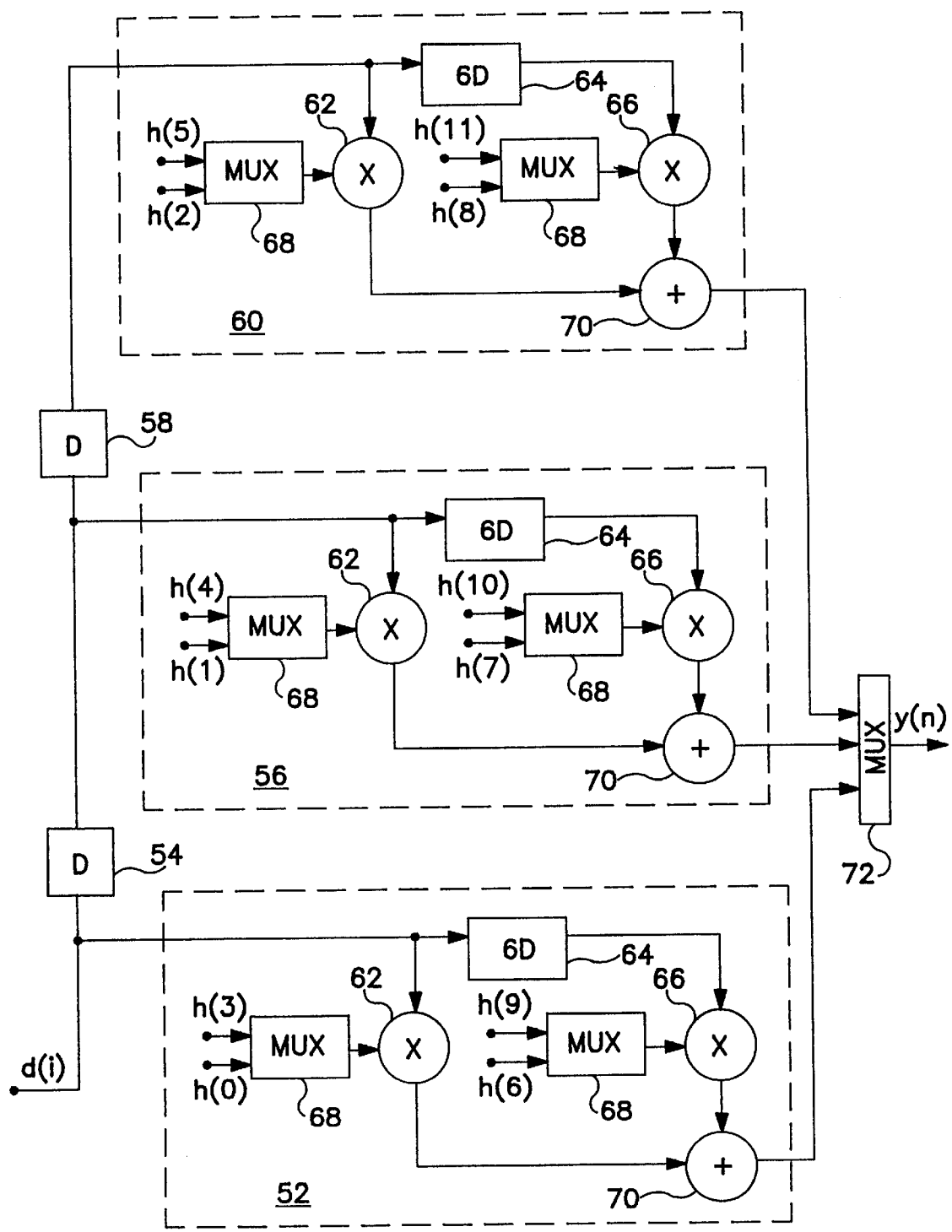
FIG. 4C is a functional block diagram of an embodiment of the filter of the present invention illustrating a compromise in circuit complexity and component operating speed, where the up-sampling ratio is three.

As shown for example in FIG. 4C in an embodiment with 12 filter coefficients L and an up-sampling ratio R of 6, there may be M=3 processing circuits. With reference to FIG. 4C, the input signal d(i) is applied to directly one processing circuit 52, through a delay circuit 54 to a second processing circuit 56, and through a second delay circuit 58 to a third processing circuit 60.

In each of the processing circuits, the signal is applied to one multiplier 62 and delayed 6 units in a delay circuit 64 before being applied to a second multiplier 66. In each of the processing circuits, R/M of the total of the L filter coefficients are grouped for each of the L/R or 2 multipliers 62, 66 and are multiplexed in one of L/R or 2 multiplexers 68. The product signals from the multipliers 68 and summed in an adder 70 in each of the processing circuits and the output signals from the three processing circuits are multiplexed in a multiplexer 72 to provide the filter output signal y(n).

From the foregoing, it will be apparent that the filter of FIG. 4C operates its components at a reduced speed and that this technique may be applied to any M where R>M and M is a factor of R.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A filter comprising:
   an input terminal adapted to receive an input signal comprising a series of digital transmit symbols d(i) at a symbol rate F;
   delay means for selectively delaying a signal applied to said input terminal to thereby provide M selectively delayed versions thereof at a sampling rate S equal to the product of the up-sampling ratio R and the symbol rate F, and where M is a factor of R and M<R;
   M processing circuits each operatively connected to said delay means to received one of the M selectively delayed versions of an input signal, each of said M processing circuits comprising:
      means for selectively delaying the received delayed version of the input signal by the symbol period 1/F to thereby provide L/R selectively delayed signals,
      L/M filter taps each adapted to receive one of the total of L filter coefficients,
      L/R multiplexers each operatively connected to R/M of said L/M filter taps,
      L/R multipliers each operatively connected to multiply the output from one of the multiplexers by one of the L/R selectively delayed signals, and
      summing means operatively connected to said L/R multipliers to sum the product signals therefrom; and
   multiplexing means operatively connected to said M processing circuits for multiplexing the output signals therefrom.

2. The filter of claim 1 wherein L=8 and wherein R=4.

3. The filter of claim 1 wherein L=12 and wherein R=6.

4. A filter comprising:
   an input terminal adapted to receive a series of digital transmit symbols d(i) at a symbol rate F;
   delay means for providing M versions of d(i) at a sampling rate S=RF where R is an up-sampling ratio and M is a factor of R;
   M processing circuits for processing one of the M versions of d(i), each of said M processing circuits comprising:
      means for selectively delaying the applied version of d(i) at the symbol rate F to thereby provide L/R signals;
      L/M filter taps each adapted to receive one of L filter coefficients,
      L/R multiplexers each operatively connected to R/M of said L/M filter taps for multiplexing signals received by the connected ones of said L/M filter taps,
      L/R multipliers each operatively connected to one of said L/R multiplexers and to said selective delaying means for multiplying the connected one of the selectively delayed versions by the output signals from the connected one of said multiplexers, and
      L/R−1 summing means operatively connected to said L/R multipliers to sum the output signals therefrom; and
   multiplexing means for multiplexing the summed output signals from said summing means.

5. The filter of claim 4 wherein L=32, M=2 and wherein R=4.

6. The method of shaping digital transmit symbols d(i) received at a rate F into shaped digital transmit symbols y(n) by L filter coefficients before such shaped symbols are converted to carrier modulating analog signals, the method comprising the steps of:
   (a) selectively delaying d(i) to provide M selectively delayed versions of d(i) at a sampling rate S=FR where R is an integer and the up-sampling ratio, where M<R<L, and where M is a factor of R;
   (b) selectively delaying each of the M selectively delayed versions of d(i) at the symbol rate F to provide L/R delayed signals;
   (c) multiplexing groups of R/M filter coefficients;
   (d) multiplying each of the multiplexed groups of R/M filter coefficients by one of the L/R delayed signals to provide a multiplication product for each of the L/R delayed signals;
   (e) combining the multiplication products for each of the L/R delayed signals to thereby provide an output signal for each of the M delayed versions; and
   (f) multiplexing the output signals to thereby provide shaped digital transmit symbols y(n) at a rate S.

* * * * *